United States Patent [19]

Webb

[11] Patent Number: 6,051,848

[45] Date of Patent: Apr. 18, 2000

[54] OPTICAL DEVICE PACKAGES CONTAINING AN OPTICAL TRANSMITTER DIE

[75] Inventor: Brian A. Webb, Chandler, Ariz.

[73] Assignee: Motorola, Inc., Schaumburg, Ill.

[21] Appl. No.: 09/033,166

[22] Filed: Mar. 2, 1998

[51] Int. Cl.[7] .................................................. H01L 33/00
[52] U.S. Cl. ........................ 257/99; 257/81; 257/82; 257/98; 257/100; 257/432; 257/433
[58] Field of Search ................................. 257/81, 82, 98, 257/99, 100, 432, 433, 435, 437, 434; 372/50

[56] References Cited

U.S. PATENT DOCUMENTS

| | | | |
|---|---|---|---|
| 3,805,347 | 4/1974 | Collins et al. | 29/25.13 |
| 4,322,628 | 3/1982 | Tanaka | 250/551 |
| 4,711,997 | 12/1987 | Miller | 250/216 |
| 4,768,070 | 8/1988 | Takizawa et al. | 357/17 |
| 4,980,568 | 12/1990 | Merrick et al. | 250/551 |
| 5,237,434 | 8/1993 | Feldman et al. | 359/19 |
| 5,258,990 | 11/1993 | Olbright et al. | 372/46 |
| 5,325,386 | 6/1994 | Jewell et al. | 372/50 |
| 5,340,993 | 8/1994 | Salina et al. | 250/551 |
| 5,500,540 | 3/1996 | Jewell et al. | 257/82 |
| 5,500,912 | 3/1996 | Alonas et al. | 385/37 |
| 5,808,325 | 9/1998 | Webb | 257/99 |
| 5,861,636 | 1/1999 | Dutta et al. | 257/99 |

*Primary Examiner*—Minh Loan Tran
*Attorney, Agent, or Firm*—David R. Collopy; A. Kate Huffman

[57] ABSTRACT

An optical device package (18) includes an optical transmitter die (10) encapsulated within mold material (20). The mold material (20) allows light emitted from the optical transmitter (10) to pass through the package (18) and can have a lens pattern (22) molded therein to focus the light emitted from the optical transmitter. The mold material (20) can also have coupling patterns (32) formed therein to allow a supplemental lens assembly (28) to be coupled thereto so that supplemental lens patterns (30) formed in the supplemental lens assembly (28) can focus the light emitted from the optical transmitter (10). The optical device package (18) can also include an optical receiver (40) enclosed within the mold material (20) and mounted on a substrate (42) with the optical transmitter (10) to provide a complete optical product in one package (18).

17 Claims, 2 Drawing Sheets

OPTICAL DEVICE PACKAGES CONTAINING AN OPTICAL TRANSMITTER DIE

BACKGROUND OF THE INVENTION

The present invention relates in general to optical devices and in particular to package assemblies for optical devices and methods for production thereof.

Optical devices include optical transmitters, optical receivers and optical systems which combine the optical transmitters and receivers. Typically, optical receivers such as imageable photodetector devices comprise a photosensitive device in a clear plastic ball grid array (PBGA) package and require ambient or artificial light sources to obtain an image. Optical receivers are used in a wide range of electronic applications including bar code readers, target recognition systems and night vision systems. In bar code readers, for example, a laser and a photodetector work together to "read" the bar code. The laser is scanned across the bar code and its reflection is received by a photodetector. The photodetector generates a digital signal representation of the bar code. The alignment between the laser, the bar code, and the photodetector is critical for accurate "reading" of the bar code. Yet, discrete optical devices such as lasers and photodetectors are conventionally not packaged together and, when combined together to form an optical system, alignment of the two discrete optical devices is exacting.

Laser diodes such as vertical-cavity surface emitting lasers (VCSELs) are also used in a wide range of electronic applications including compact disc players and drives, bar code readers, and other similar identification and data storage technologies. Laser diodes are typically side-emitting lasers that are mounted in special metal cans having a clear lens in the top of the can. There are several industry standard metal cans for these applications, for example the TO-46 and TO-56 metal cans. Because side-emitting lasers generate significant heat and degrade if overheated, metal cans like the above provide sufficient heat dissipation during operation. Typically, the metal can is mounted to a header, a laser die is mounted on a post that rises vertically above the header, and a lens is mounted separately on top of the metal can. The resulting package is often not hermetic.

These conventional laser diode packages suffer from several disadvantages including high manufacturing costs due to the need for a special mounting header and metal can. Further, with these metal can packages, critical optical alignment of the laser diode and the package is required at the time of manufacturing an optical system, at which time the metal can package must be mated to another optical component, such as an optical tube containing lenses. Alignment at this point in manufacture is critical because tolerances are as small as 10 microns. As a result of this critical alignment and tight tolerance, automatic manufacture is impossible and yield losses are significant.

Accordingly, there is a need for improved optical system packaging that has reduced manufacturing cost and improved yields, that does not require critical post-manufacturing alignment for cooperative operation between photodetectors and lasers, and that permits automated manufacturing and packaging of the optical system.

DETAILED DESCRIPTION OF THE DRAWINGS

Figure 1:
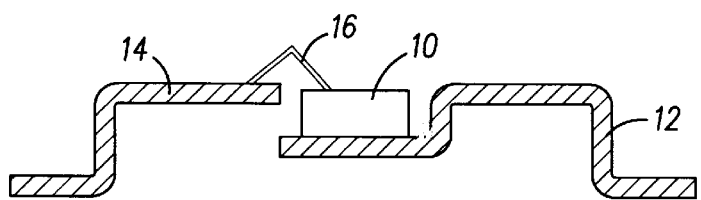
FIG. 1 is an optical transmitter mounted on a lead frame in accordance with the preferred embodiment of the present invention.

Referring to FIG. 1, an optical device includes a die 10, which is preferably an optical transmitter. In accordance with a preferred embodiment of the present invention, the die 10 is a vertical-cavity surface-emitting laser (VCSEL). VCSELs can be fabricated to emit light in the form of visible laser radiation having characteristic wavelengths in the range between 400 and 900 nanometers. A VCSEL which emits light in the visible region of the electromagnetic spectrum can be incorporated into an optical device for applications in bar code readers, data transmission, compact disc players, and laser pointers.

The die 10 is mounted to a lead frame 12 which, preferably, is adaptable for surface mounting. Because a VCSEL device requires much less power for the same light output as conventional edge emitting lasers, conventional integrated circuit molded leadframe packaging technology may be used for device fabrication. In mounting the die 10 to the lead frame 12, the die 10 is wirebonded to a portion of the lead frame comprising one or more of the plurality of leads of the lead frame 12. To accommodate injection molding, the wire is preferably short and stiff with dimensions less than 2.5 millimeter (mm) long and greater than 0.025 mm in diameter.

Figure 2:
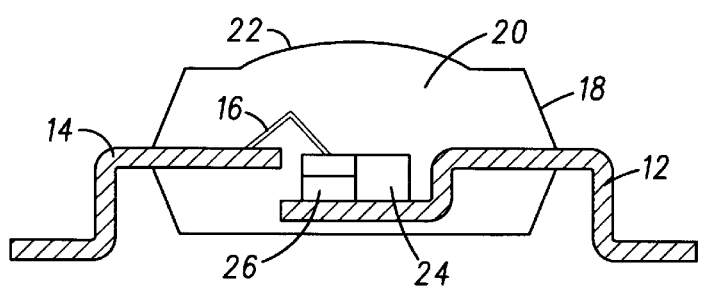
FIG. 2 is the optical transmitter of FIG. 1 after packaging.

Referring next to FIG. 2, a package 18 is formed from mold material 20 to enclose the optical transmitter by encapsulating the die 10 within the mold material 20. The mold material 20 is a material which is clear to some or all of the characteristic wavelengths of the VCSEL such as Hysol MG18 for transfer molding or a clear injection molded material such as styrene. Before hardening, a portion of the mold material 20 is shaped to form an integral lens pattern 22 therewithin. The lens pattern 22 is formed in the mold material 20 to focus the light emitted from the optical transmitter die 10 as it passes through and out of the mold material 20.

The molded packaging in accordance with the preferred embodiment of the present invention reduces the cost of manufacture of the optical device in at least two ways. First, the replacement of the high cost mounting headers and metal cans of conventional VCSEL packages with the clear mold compound reduces piece part cost. Second, the critical alignment during conventional manufacturing where the metal can is coupled to a lens assembly is eliminated because the lens assembly in accordance with the preferred embodiment of the present invention is formed in the mold material during the molding operation. Elimination of the need for critical alignment in accordance with the present invention improves the manufacturing yield of optical devices.

The laser power output of VCSEL dies varies with age and operating temperature. In accordance with the preferred embodiment of the present invention, the optical transmitter die 10 comprises a VCSEL 24 coupled to automatic power control (APC) circuitry 26. The APC circuit 26 controls the operational power of the VCSEL 24 to prevent the VCSEL 24 from exceeding a predetermined threshold power limit, thereby controlling the operational temperature of the VCSEL 24.

Figure 3:
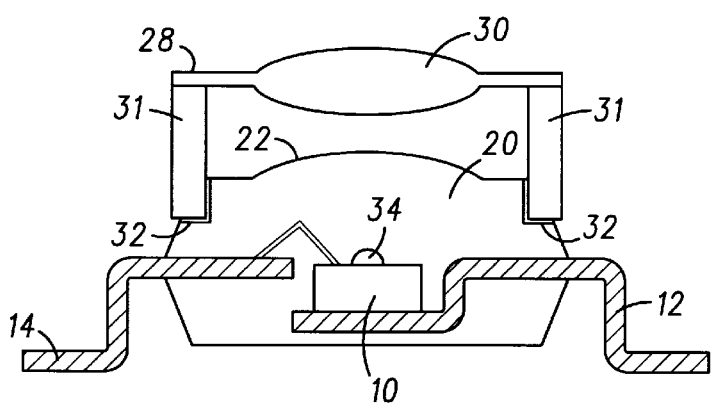
FIG. 3 is the optical transmitter of FIG. 2 coupled to a supplemental lens assembly.

Referring to FIG. 3, in accordance with the preferred embodiment of the present invention, a premolded supplemental lens system 28 comprises an external lens 30 and is coupled to the package 18 by legs 31. During injection molding, a coupling pattern 32 is shaped in the package 18 to allow the supplemental lens system 28 to be coupled to the package 18. The coupling pattern 32 is formed such that when the supplemental lens system 28 is physically coupled to the package 18, the external lens 30 is aligned with the lens pattern 22 and the optical transmitter die 10 to focus the light emitted by the die 10 and passing through the lens pattern 22. For improved focus of the light emitted from the optical transmitter 10, a lenslet 34 could be formed on the optical transmitter die 10 to cooperatively work with the lens pattern 22 and the external lens 30.

The supplemental lens system 28 could also improve the operation of an optical device comprising an optical receiver die encapsulated within mold material 20. Light passing through the external lens 30 would be directed to the lens pattern 22 and the focused onto the optical receiver die.

Figure 4:
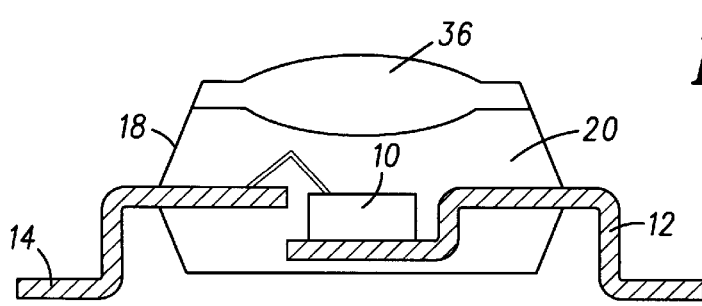
FIG. 4 is an alternate embodiment of the optical transmitter of FIG. 2.

In accordance with an alternate embodiment of the present invention, a wavelength selective optical device package as pictured in FIG. 4 could be formed from the optical device of FIG. 2 by choosing a mold material 20 which has certain light-passing properties and by coupling an antireflective material coating 36 which may be formed to include the lens pattern 22 to the mold material 20, the antireflective material having the light blocking property of selectively blocking certain wavelengths of light. For example, to manufacture an optical transmitter which emits light in the range of 825 nanometers to 875 nanometers, a mold material 20 is chosen with the property of blocking light below 825 nanometers. In forming the package 18, a second material 36 having light blocking properties is laminated or comolded onto the mold material 20, the second material 36 having the property of blocking light above 875 nanometers. The second material may also be configured by comolding, hot stamping or other methods to serve as a lens by incorporating the lens pattern 22.

Figure 5:
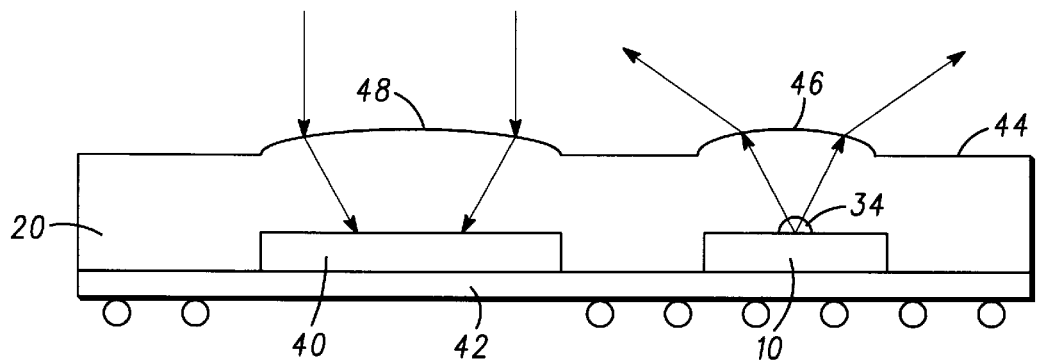
FIG. 5 is an optical device comprising an optical transmitter and an optical receiver mounted on a substrate and packaged in accordance with the preferred embodiment of the present invention.

The reduction of power dissipation requirements and piece parts and the clear mold material 20 of the optical device package of the preferred embodiment of the present invention permits the combination of optical transmitters comprising VCSELs and optical receivers into a single package. In accordance with this aspect of the preferred embodiment of the present invention, FIG. 5 depicts an imageable photodetector die 40 mounted on and coupled through a ball grid array (BGA) substrate 42. The optical transmitter die or VCSEL 10 is mounted on the same BGA substrate 42. The package 44 is formed over the dies 10, 40 by molding of the clear mold material 20 over the substrate 42 to enclose and encapsulate the dies 10, 40. The mold material 20 is clear to some or all of the characteristic wavelengths of the VCSEL 10.

During molding, first and second lens patterns 46 and 48 are integrally formed in the mold material 20. The first lens pattern 46 focuses light emitted from the VCSEL 10 as it passes through the mold material 20. The second lens pattern 48 focuses light as it passes into and through the mold material 20 onto the receiver die 40.

An optical device manufactured in accordance with FIG. 5 provides a single package optical device for bar code readers and optical data readers. These optical devices would also provide small, low cost solutions for optical recognition systems, target recognition systems, night vision systems, security systems and wireless data transmission systems. Multiple optical transmitter dies 10 could be mounted on the substrate 42 to improve illumination from the optical device. Also, multiple optical receivers 40 could be mounted on the substrate to produce a binocular effect particularly suitable for night vision systems.

Figure 6:
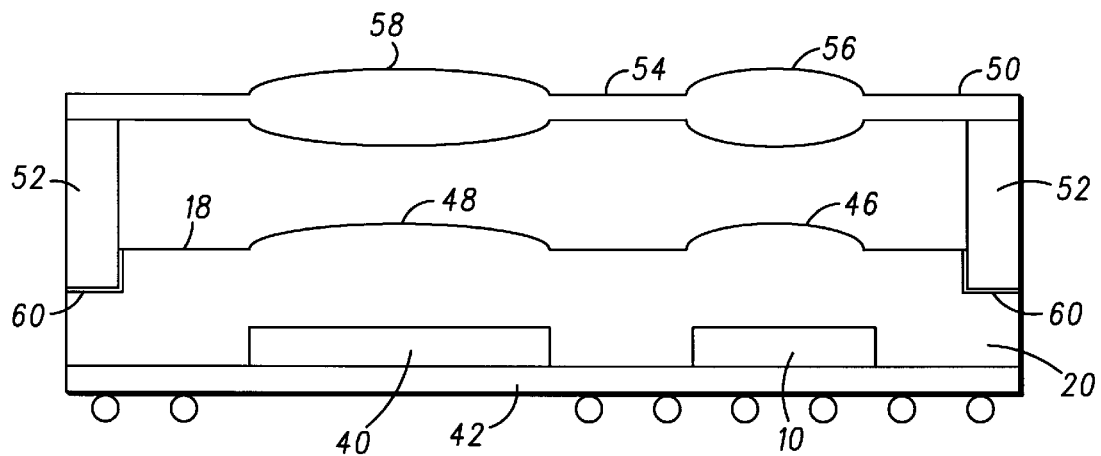
FIG. 6 is the optical transmitter and optical receiver package of FIG. 4 wherein the package is coupled to the supplemental lens assembly.

An optical device with improved focus in accordance with the preferred embodiment of the present invention is depicted in FIG. 6. A premolded supplemental lens assembly 50 is comprised of legs 52 coupled to a cross bar 54 and first and second supplemental lens patterns 56, 58 molded into the cross bar 54. The mold material 20 of the package 18 is molded to form a coupling patterns 60 in the package 18. The coupling patterns 60 allow physical coupling of the legs 52 to the package 18.

The first supplemental lens pattern 56 is formed and located within the supplemental lens assembly 50 to cooperatively work with the first lens pattern 46 in the mold material 20 to focus light emitted from the VCSEL 10. The second supplemental lens pattern 58 is formed and located within the supplemental lens assembly 50 to cooperatively work with the second lens pattern 48 in the mold material 20 to focus light passing through the supplemental lens system 50 and the mold material 20 onto the photodetector die 40.

Multiple VCSELs 10 or multiple photodetectors 40 mounted on the substrate 42 would require a plurality of first and second supplemental lens patterns 56, 58 to be formed in the supplemental lens assembly.

By now it should be appreciated that there has been provided small volume optical device package comprising an optical transmitter alone or in combination with an optical receiver. The optical device package of the present invention can be manufactured in an automated manufacturing environment at reduced cost and with improved yield as a leaded or BGA component to allow for surface mounting of the component. The optical device package can be manufactured to package optical transmitters and optical receivers together to alleviate the need for post manufacturing critical alignment.

What is claimed is:

1. An optical device comprising:
   an optical transmitter die operating in an operational temperature for emitting light having characteristic light waves, the optical transmitter die comprising an automatic power control circuitry coupled to a vertical-cavity surface-emitting laser (VCSEL), the circuitry controlling operational power of the VCSEL to prevent the operational power from exceeding a threshold power limit; and a package comprising mold material which encapsulates the optical transmitter die, wherein the mold material is clear to at least one of the characteristic wavelengths.

2. An optical device comprising:
   a substrate;
   at least one optical receiver mounted on the substrate;
   at least one optical transmitter mounted on the substrate for emitting light having characteristic wavelengths; and
   a package comprising mold material mounted on the substrate, the mold material encapsulating the at least one optical receiver and the at least one optical transmitter, wherein the mold material is clear to at least one of the characteristic wavelengths of the at least one optical device and the mold material has a first integral lens pattern formed therein, the first integral lens pattern being formed in the mold material to focus light emitted from the at least one optical transmitter and passing through the mold material.

3. The optical device of claim 1 further comprising a plurality of leads coupled to the optical transmitter die wherein one of the plurality of leads is electrically and physically coupled to the optical transmitter die by a wire.

4. The optical device of claim 3 wherein the wire has a length less than 2.5 millimeters (mm) and has a diameter greater than 0.025 mm.

5. The optical device of claim 1 wherein the package further comprises a material coating having light blocking properties and physically coupled to the mold material for selectively blocking certain wavelengths.

6. The optical device of claim 1 wherein the package further comprises a material coating physically coupled to the mold material and formed to act as a lens.

7. The optical device of claim 1 wherein the mold material has an integral lens pattern formed therein, the integral lens pattern being formed in the mold material to focus light emitted from the optical transmitter die and passing through the mold material.

8. The optical device of claim 7 wherein the package is formed to align the integral lens pattern to a supplemental lens system when physically coupled thereto.

9. The optical device of claim 2 wherein the mold material has a second integral lens pattern formed therein, the second integral lens pattern being formed in the mold material to focus light passing through the mold material and received by the at least one optical receiver.

10. The optical device of claim 2 further comprising a supplemental lens assembly, wherein the mold material is formed to physically couple the package to the supplemental lens assembly and wherein the supplemental lens assembly comprises a first supplemental lens pattern, the first supplemental lens pattern being formed and located within the supplemental lens assembly to focus light emitted from the at least one optical transmitter which passes through the first integral lens pattern and through the supplemental lens assembly.

11. The optical device of claim 2 wherein the mold material has a second integral lens pattern formed therein, the second integral lens pattern being formed in the mold material to focus light passing through the mold material and received by the at least one optical receiver.

12. The optical device of claim 11 further comprising a supplemental lens assembly, wherein the mold material is formed to physically couple the package to the supplemental lens assembly and wherein the supplemental lens assembly comprises a second supplemental lens pattern, the second supplemental lens pattern being formed and located within the supplemental lens assembly to focus light passing through the supplemental lens assembly and the second integral lens pattern and received by the at least one optical receiver.

13. The optical device of claim 2 wherein the mold material is formed to physically couple the package to a supplemental lens system.

14. The optical device of claim 2 comprising a supplemental lens assembly wherein the supplemental lens assembly comprises a first supplemental lens pattern, the first supplemental lens pattern being formed and located within the supplemental lens assembly to focus light emitted from the at least one optical transmitter and passing through the supplemental lens assembly.

15. The optical device of claim 14 wherein the supplemental lens assembly comprises a second supplemental lens pattern, the second supplemental lens pattern being formed and located within the supplemental lens assembly to focus light passing through the supplemental lens assembly and received by the at least one optical receiver.

16. The optical device of claim 14 wherein the supplemental lens assembly comprises a second supplemental lens pattern, the second supplemental lens pattern being formed and located within the supplemental lens assembly to focus light passing through the supplemental lens assembly and received by the at least one optical receiver.

17. The optical device of claim 2 wherein the at least one optical transmitter comprises at least one vertical-cavity surface-emitting laser (VCSEL) die.

* * * * *